(12) United States Patent  
Elrabaa (10) Patent No.: US 8,610,511 B1  
(45) Date of Patent: Dec. 17, 2013

(54) HIGH-FREQUENCY DIGITALLY CONTROLLED OSCILLATOR

(75) Inventor: Muhammad E. S. Elrabaa, Dhahran (SA)

(73) Assignees: King Fahd University of Petroleum and Minerals, Dhahran (SA); King Abdulaziz City for Science and Technology, Riyadh (SA)

( * ) Notice: Subject to any disclaimer, the term of this patent is extended or adjusted under 35 U.S.C. 154(b) by 0 days.

(21) Appl. No.: 13/563,180

(22) Filed: Jul. 31, 2012

(51) Int. Cl.  
    *H03K 3/03* (2006.01)

(52) U.S. Cl.  
    USPC ........ 331/57; 331/2; 331/48; 331/49; 331/55; 331/56; 331/74

(58) Field of Classification Search  
    USPC ............. 331/2, 45, 46, 48, 49, 51, 52, 55, 56, 331/57, 74  
    See application file for complete search history.

(56) References Cited

U.S. PATENT DOCUMENTS

| | | | |
|---|---|---|---|
| 5,126,691 A | | 6/1992 | Mijuskovic et al. |
| 5,175,452 A | * | 12/1992 | Lupi et al. .................... 327/262 |
| 5,278,522 A | * | 1/1994 | Atriss et al. .................... 331/57 |
| 5,298,870 A | * | 3/1994 | Cytera et al. .................... 331/45 |
| 5,416,444 A | * | 5/1995 | Yamauchi et al. ............. 331/45 |
| 5,475,344 A | * | 12/1995 | Maneatis et al. ................ 331/57 |
| 5,490,182 A | | 2/1996 | Arai |
| 5,727,038 A | | 3/1998 | May et al. |
| 6,020,781 A | * | 2/2000 | Fujioka ......................... 327/541 |
| 6,134,191 A | * | 10/2000 | Alfke ............................. 368/118 |
| 6,204,694 B1 | * | 3/2001 | Sunter et al. ..................... 326/93 |
| 6,389,091 B1 | | 5/2002 | Yamaguchi et al. |
| 6,617,936 B2 | * | 9/2003 | Dally et al. ...................... 331/57 |
| 6,687,321 B1 | | 2/2004 | Kada et al. |
| 6,864,752 B2 | * | 3/2005 | Caresosa et al. ................ 331/16 |
| 7,683,725 B2 | * | 3/2010 | Kim et al. ....................... 331/57 |
| 7,710,208 B2 | * | 5/2010 | Goff ................................ 331/57 |
| 7,952,411 B2 | | 5/2011 | Warren |
| 8,044,728 B2 | * | 10/2011 | Barasinski ...................... 331/57 |
| 2006/0215798 A1 | | 9/2006 | Nelson |
| 2007/0247240 A1 | | 10/2007 | Morini et al. |

* cited by examiner

*Primary Examiner* — Levi Gannon  
(74) *Attorney, Agent, or Firm* — Richard C. Litman (57) ABSTRACT

The high-frequency digitally controlled oscillator includes fully digital cells capable of being ported to any CMOS fabrication process. The oscillator has a basic modular architecture comprising a digitally controlled digital ring oscillator (DRO) having a plurality of delay stages, a counter divider and a selection multiplexer. The DRO generates the basic (intrinsic) high frequency range and the counter provides the remaining ranges through division by multiples of two. The multiplexer provides a selection mechanism for the required range of frequencies. Load capacitances to the delay stages are added/removed to control delay via utilization of a unique capacitive cell driven synchronously by two ring oscillators such that the capacitance could be added or removed utilizing the Miller effect. Moreover, multiple capacitive load cells can be added to the same stage. This configuration electrically removes the effect of un-enabled shunt load capacitances, thereby increasing the intrinsic frequency range of the DRO.

7 Claims, 7 Drawing Sheets

When the switch is off, each inverter sees a load $\approx 0.5(C\,C_J)/(C+C_J) < 0.5\,C_J$

Fig. 5A

When the switch is ON, each inverter sees a load $\approx C$

Controlling the DDSs in a tandem binary fashion.

Fig. 6B

Controlling the DDSs in a thermometer coding fashion.

HIGH-FREQUENCY DIGITALLY CONTROLLED OSCILLATOR

BACKGROUND OF THE INVENTION

1. Field of the Invention

The present invention relates to oscillators in the gigahertz range, and particularly to a high-frequency digitally controlled oscillator having an extended range of frequency operation.

2. Description of the Related Art

Many applications require the generation of high-speed clocks on-chip with minimal area and power consumption. Analog phase-locked loops (PLLs) can provide precise frequencies, but contain analog circuits and an analog filter that take up a large amount of chip space and are impossible to port from one fabrication process to another. All digital PLLs are more portable and have smaller area on chip. However, they require digitally controlled oscillators (DCOs) with monotonic behavior, fine frequency resolution, and good period linearity. Over the years, many DCOs have been proposed. Almost all of the reported DCOs use two stages for frequency tuning, including a coarse tuning stage and a fine tuning stage. This allows the DCO to have a large frequency range with fine resolution while using a minimal number of control bits. This, however, may also limit the maximum output frequency of the DCO.

Existing DCOs employ one or more techniques, including using current-starved inverters as delay stages, using inverters with switched shunt MOS capacitors, and using multiplexers to select the number of delay stages (path selection). Path selection is seldom used on its own due to its limited resolution, and is usually combined with other techniques. For shunt capacitors, some researchers use MOS varactors with differential drive due to their excellent linearity. This, however, requires a large number of delay stages due to the small capacitance of varactors. Pass gates may be used between inverter stages as digitally-controlled variable resistors, and Schmitt triggers may be used to re-construct the weakened signals. Although all these techniques work effectively to produce fine resolution and large frequency range with adequate linearity, they all suffer from a basic shortcoming, viz., limited maximum frequency. This is due to the fact that whatever technique is used to control the DCO's period, the elements that are used to control the delay around the DCO (series resistances, shunt capacitors, or selection multiplexers) always exist in the circuit and can't be physically eliminated at the highest DCO frequency. Also, switches (NMOS, PMOS or transmission gates) controlling these elements introduce significant parasitic capacitances, reducing the DCO's maximum attainable frequency further. These two issues lead to a basic trade off in all existing DCOs. In order to increase the resolution and/or frequency range, more delay elements have to be added, which reduces the DCO's intrinsic (maximum) frequency. Also, in order to increase the range, the range of values of the binary-weighted resistors or capacitors (used as delay control elements in the DCO) must be increased. This causes matching problems and can lead to non-monotonic DCO frequency characteristics at some control code words. This also forces designers to use the highly non-linear MOS capacitors to be able to get large capacitance values in reasonable silicon area.

Thus, a high-frequency digitally controlled oscillator solving the aforementioned problems is desired.

SUMMARY OF THE INVENTION

The high-frequency digitally controlled oscillator includes fully digital cells capable of being ported to any CMOS fabrication process. The oscillator has a basic modular architecture comprising a digitally controlled digital ring oscillator (DRO) having a plurality of delay stages, a counter divider, and a selection multiplexer. The DRO generates the basic (intrinsic) high frequency range, and the counter provides the remaining ranges through division by multiples of two.

The multiplexer provides a selection mechanism for the required range of frequencies. Load capacitances to the delay stages are added/removed to control delay via utilization of a unique capacitive cell driven by two ring oscillators in synchrony so that the capacitance can be added or removed utilizing the Miller effect.

Moreover, multiple capacitive load cells can be added to the same stage. This configuration electrically removes the effect of un-enabled shunt load capacitances, thereby increasing the intrinsic frequency range of the DRO.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
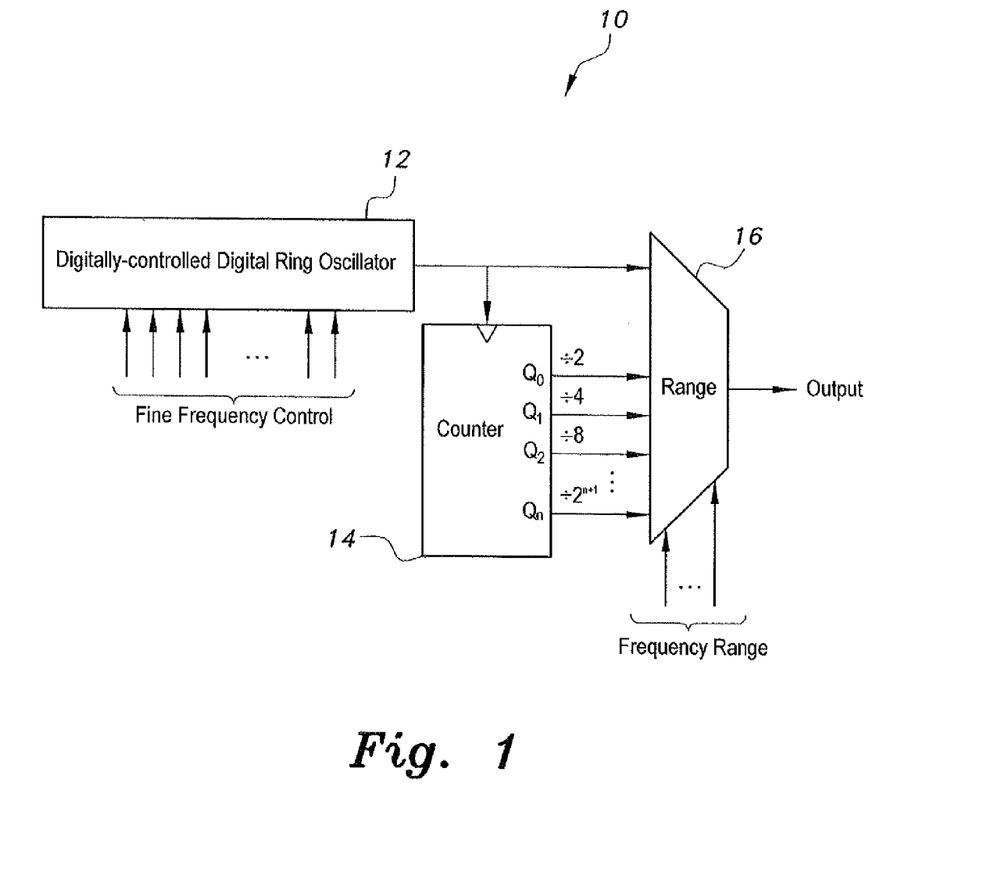
FIG. 1 is a block diagram showing the architecture of a high-frequency digitally controlled oscillator according to the present invention.
Figure 2:
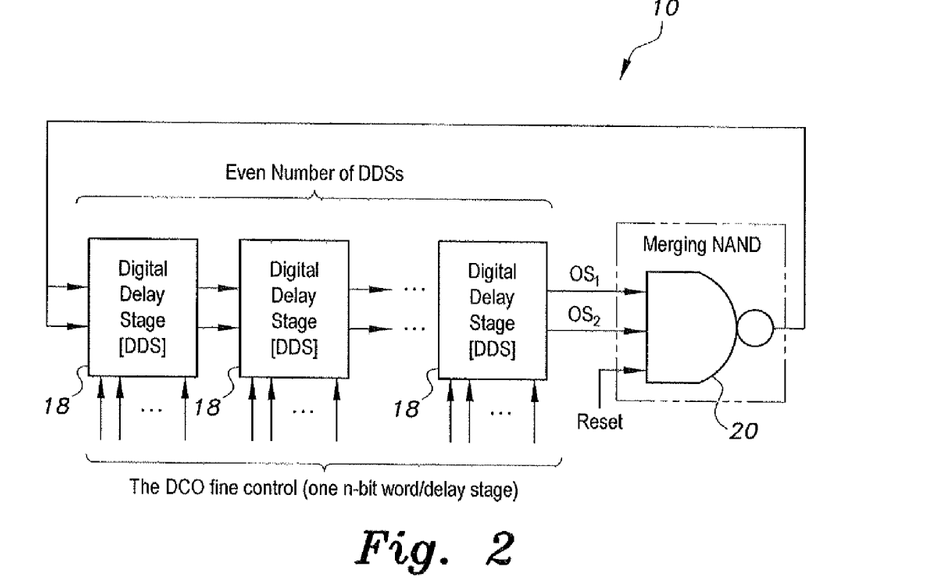
FIG. 2 is a block diagram of an exemplary digital ring oscillator of the high-frequency digitally controlled oscillator of FIG. 1.

The high-frequency digitally controlled oscillator 10 includes fully digital cells capable of being ported to any CMOS fabrication process. As shown in FIGS. 1 and 2, the oscillator 10 has a basic modular architecture comprising a digitally-controlled digital ring oscillator (DRO) 12 having a plurality of delay stages 18, a counter divider 14 and a frequency range selection multiplexer 16. The DRO 10 generates the basic (intrinsic) high frequency range, and the counter 14 provides the remaining ranges through division by multiples of two. A ring oscillator is a device composed of an odd number of NOT gates whose output oscillates between two voltage levels, representing true and false. The NOT gates, or inverters, are attached in a chain or cascade. The output of the last inverter is fed back into the first.

Figure 4:
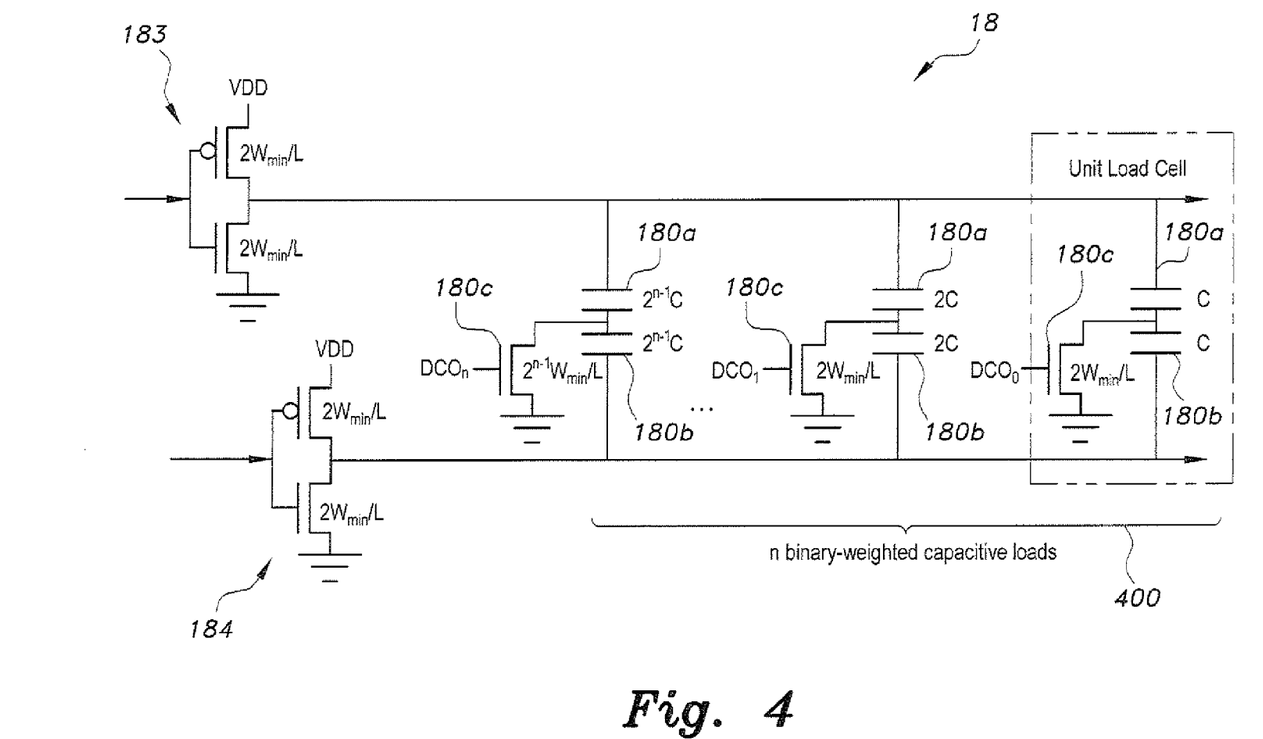
FIG. 4: is a schematic diagram showing a digital delay stage (DDS) having binary weighted capacitive loads for a high-frequency digitally controlled oscillator according to the present invention.

The multiplexer 16 provides a selection mechanism for the required range of frequencies. As shown in FIG. 4, the digital delay stages 18 include load capacitances 400, which are added/removed to control delay via utilization of a unique capacitive cell driven by two ring oscillators in synchrony such that the capacitance could be added or removed utilizing the Miller effect. The Miller effect accounts for the increase in the equivalent input capacitance of an inverting voltage amplifier due to amplification of the effect of capacitance between the input and output terminals.

Additionally, multiple capacitive load cells 400 can be added to the same stage 18. This configuration electrically removes the effect of un-enabled shunt load capacitances, thereby increasing the intrinsic frequency range of the DRO 10.

The capacitive load cells use shunt capacitors 180*a* and 180*b*, which exploit the Miller effect. Two series capacitors 180*a* and 180*b* (with the node in between them floating) connected between two nodes of identical phase will appear as zero capacitance for both nodes. If the node in between the capacitors is connected to ground, then each node will see the full capacitance connected to it.

As shown in FIG. 1 the general architecture of the proposed DCO 10 comprises a digitally-controlled digital ring oscillator (DRO) 12 used for producing the basic high frequency range. The DRO 12 is connected to a synchronous binary counter 14, which is used for range selection (by dividing the DRO's frequency by a multiple of 2) at the multiplexer 16. Hence, the required DRO frequency range is: $f_{max}$–0.5 $f_{max}$, where $f_{max}$ is the DRO's maximum frequency. In other words, the minimum frequency of the DRO must be less than or equal to one-half of the largest frequency. This ensures a continuous frequency range with successive division by 2. As such, the required range of the DRO 10 is relatively small, allowing for finer resolution with few bits of control word. It also means that the maximum shunt capacitance is significantly reduced, preserving the DRO's signal slopes and improving linearity. The reduced range of capacitance values also makes it easier to ensure monotonicity of the oscillator 10.

Figure 3:
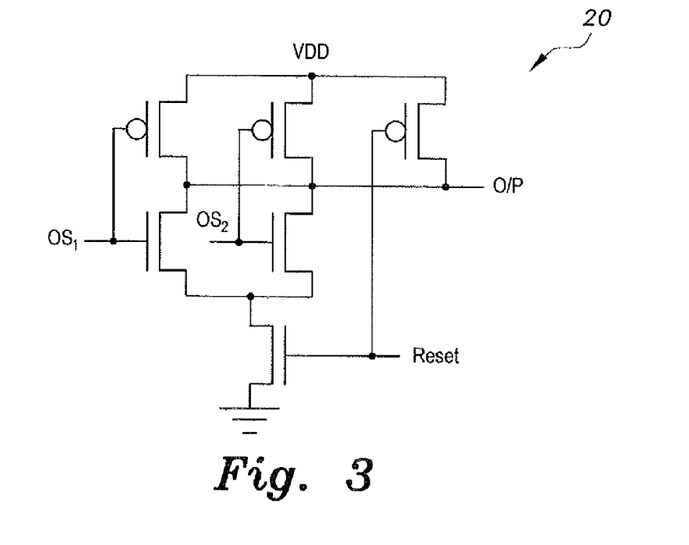
FIG. 3: is a schematic diagram showing details of the merging NAND gate of the digital ring oscillator of FIG. 2.

The DRO 12 is basically made of two digital oscillators 183, 184 having identical inverters (shown in FIGS. 2 and 4) and a merging NAND gate 20 (shown in FIGS. 2 and 3). The two oscillators 183, 184 are set to oscillate at the same frequency and phase. The merging NAND gate 20 resets the oscillators 183, 184 to start at the same exact moment. It also 'merges' the two oscillators' last-stage (last digital delay stage (DDS) 18) signals, ensuring phase and frequency synchronization between the two oscillators 183, 184 under process variations.

At each of the DDS stages 18 of the DRO, the two oscillators 183, 184 will have identical phases. The binary weighted, digitally controlled, capacitive loads 180*a*, 180*b* are connected between each delay stage in oscillator 183 and the corresponding stage in oscillator 184. Each DDS stage includes n+1 capacitive load cells, which are made of two identical capacitors 180*a*, 180*b* connected in series with an NMOS switch 180*c* that conditionally connects the node in-between the two capacitors 180*a*, 180*b* to ground. The switches 180*c* are controlled by an n-bit fine frequency control word of the DCOs 183, 184.

Figure 5A:
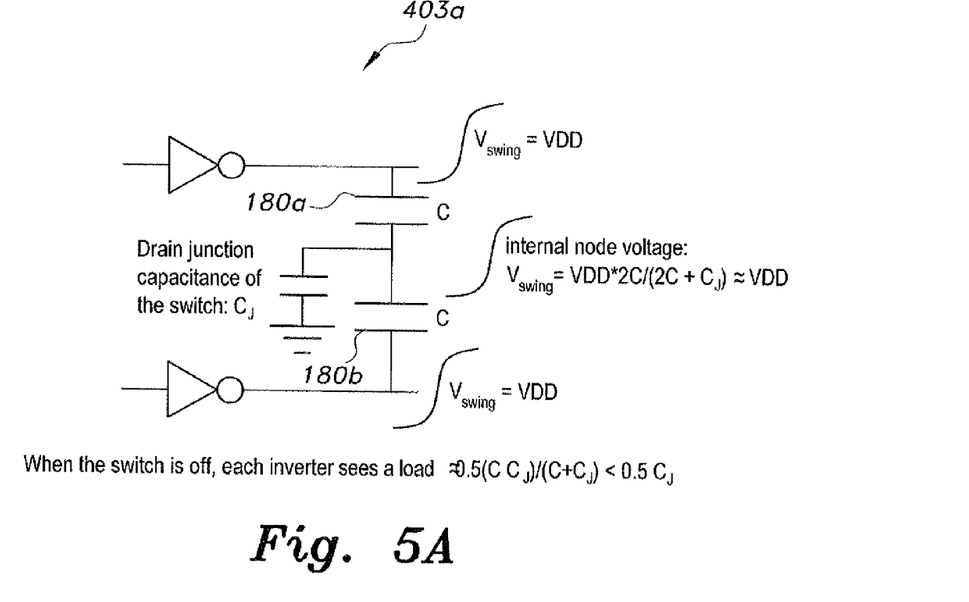
FIG. 5A is a schematic diagram showing the capacitive load of the high-frequency digitally controlled oscillator according to the present invention, shown when the switch is in the "OFF" position.
Figure 5B:
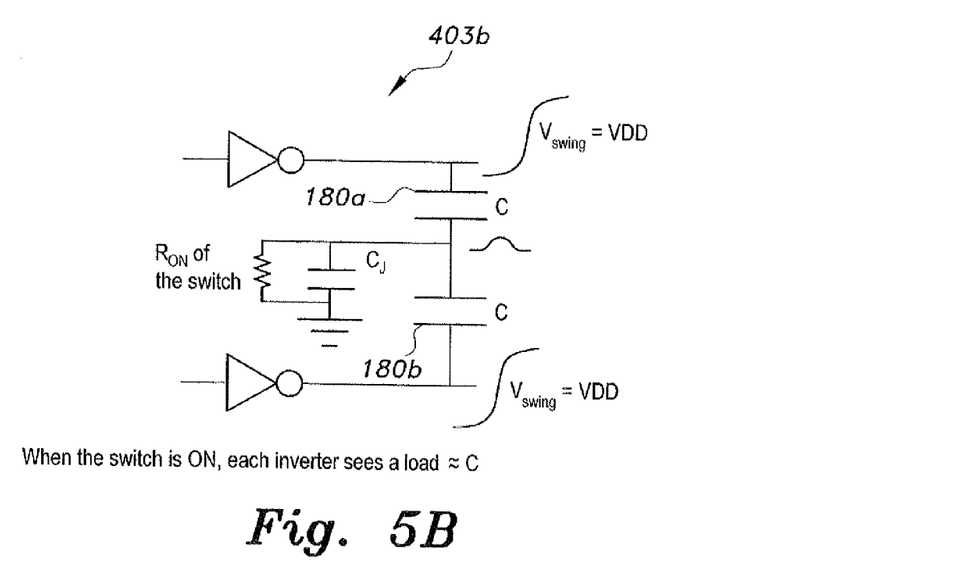
FIG. 5B is a schematic diagram showing the capacitive load of the high-frequency digitally controlled oscillator according to the present invention, shown when the switch is in the "ON" position.

FIGS. 5A-5B illustrate the basic concept of the capacitive load switching. In condition 403*a*, when the NMOS switch 180*c* is OFF, only its small (relative to C) drain junction capacitance (Cj) is connected between the common node and ground. Since the capacitor combination is driven from both ends with identical phase, each of the two inverters in the two oscillators 183, 184 sees very small capacitances (<0.5 Cj). When the switch 180*c* is ON, the common node is connected to ground and each inverter sees a load of C, which increases its delay (but identical phase between the two oscillators is still maintained). Hence, unlike conventional shunt capacitance schemes, this new scheme results in a large capacitance difference between the two states, since there is no parasitic capacitance at the inverters' outputs. This means that the required frequency range and resolution could be obtained with small values of C and few load cells 400. It should be noted here that the shunt capacitances 180*a* and 180*b* must be implemented with metal layers, not MOS capacitors, to avoid excessive parasitic capacitances. This, however, is not a problem, since the required values are very small. As an example, for a 3-stage DRO implemented in a 0.13 μm technology with a 4-bit control word, the required value for C is 0.5 fF (femtoFarad). This yields a DRO frequency range of 2.5-5 GHZ, an unprecedented range for this technology. For this technology, the 0.5° F. capacitance could be implemented using a 2.5 μm² Metal1-Poly capacitor (with 0.21 fF/μm² capacitance).

For proper portability of the DRO to any fabrication process, it has to be ensured that $f_{max} \geq 2\, f_{min}$ (i.e., the lowest frequency obtained is at most one-half the maximum frequency). That means the maximum delay through a DRO stage must be at least twice its minimum delay, i.e., $TD_{max} \geq TD_{min}$. Also, to improve linearity of the DRO, the sizes of the NMOS switches 180*c* in the capacitance cells have to be increased at the same ratio of the capacitance (i.e., binary-weighted fashion). The minimum value of C that is needed for proper DRO operation can be estimated as follows. First, the following two equations give approximate values of $TD_{min}$ and $TD_{max}$ based on a simple RC delay model:

$$TD_{min} = R_{eq}(C_{in} + 0.5(2^n - 1)C_j) \quad (1)$$

$$TD_{max} = R_{eq}(C_{in} + (2^n - 1)C) \quad (2)$$

where $R_{eq}$ is the equivalent resistance of the CMOS inverter in the DDS, $C_{in}$ is its input capacitance, $C_j$ is the unit drain junction capacitance of the NMOS switch in the capacitance cell (its value is split between the two inverters), n is the number of control bits/DDS, and C is the unit load capacitance (FIG. 2(*c*)). Hence, from equations (1) and (2) above, the condition for proper operation of the DRO is:

$$C \geq \frac{C_{in} + (2^n - 1)C_j}{(2^n - 1)} = \frac{C_{in}}{2^n - 1} + C_j \quad (3)$$

Figure 6A:
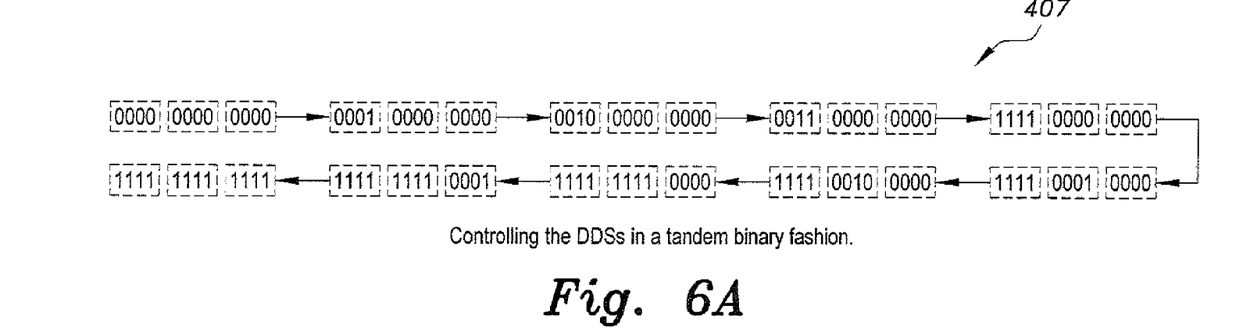
FIG. 6A shows an exemplary control word pattern for tandem binary control of the digital delay stages in a high-frequency digitally controlled oscillator according to the present invention.
Figure 6B:
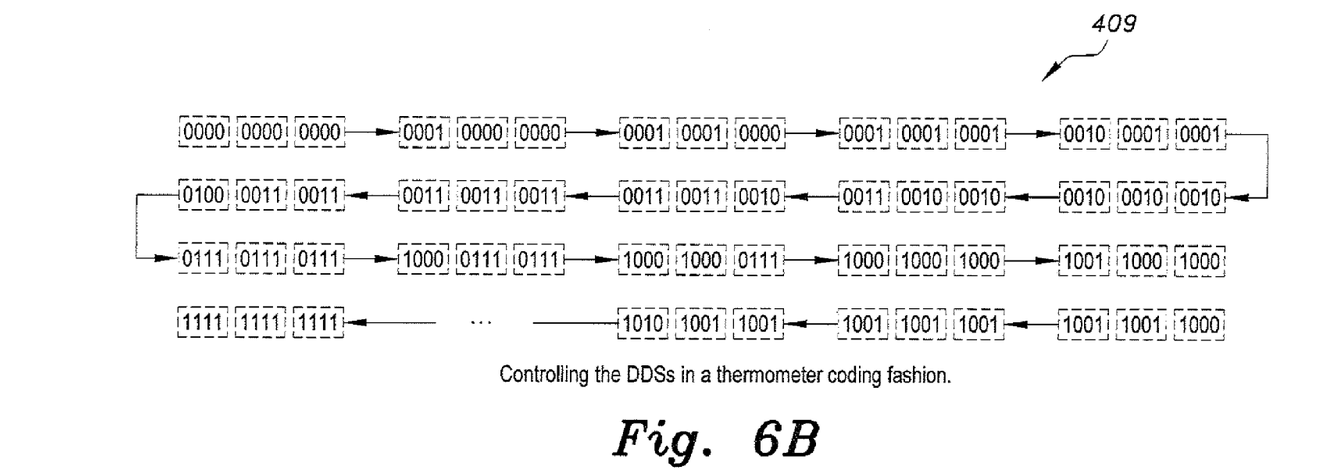
FIG. 6B shows an exemplary control word pattern for thermometer coding control of the digital delay stages in the high-frequency digitally controlled oscillator according to the present invention.

As each DDS has its own control word, there are many ways to control the DRO. If all words are treated as one big word, then there will be many redundant words that will cause non-monotonic DRO characteristics. As such there are two main ways to properly control the DRO to ensure non-redundant codes. One way is to control the DDSs in a round-robin binary fashion 407, as shown in FIG. 6A. The other is to control all the DDSs' loads in thermometer coding fashion 409, as shown in FIG. 6B. In the first method, starting with the first DDS, its control word is binary-incremented until it reaches its maximum value, then the control word for the second DDS is incremented until it reaches its maximum value, then the control word for the third DDS is incremented, and so on. This is equivalent to dividing the frequency range into a number of sub-ranges equal to the number of DDSs. This control method is very straight forward to accomplish using a series of saturating counters, each counter starting when its predecessor saturates. Its linearity, however, is worse than the second method due to the dependency of the steps on the input slope. In the second method, the load capacitances are enabled in thermometer coding fashion. The 1C (the smallest capacitance) of the first DDS is enabled, then the 1C of the second DDS, then the 1C of the third DDS, until the 1C of the last DDS is enabled. Next the 2C of the first DDS is enabled and its 1C is disabled, then the 2C of the second DDS is enabled and its 1C is disabled, and so on till all the 2Cs are enabled. Then another round of enabling the Cs, followed by a round of enabling the 4Cs and disabling the C and 2C of each DDS. This will be followed by another round of enabling the Cs, followed by a round of enabling the 8Cs and disabling the C, 2C and 4C of each DDS and so on until all loads in all DDSs are enabled (minimum frequency). This method achieves excellent linearity but is very difficult to control.

Figure 7:
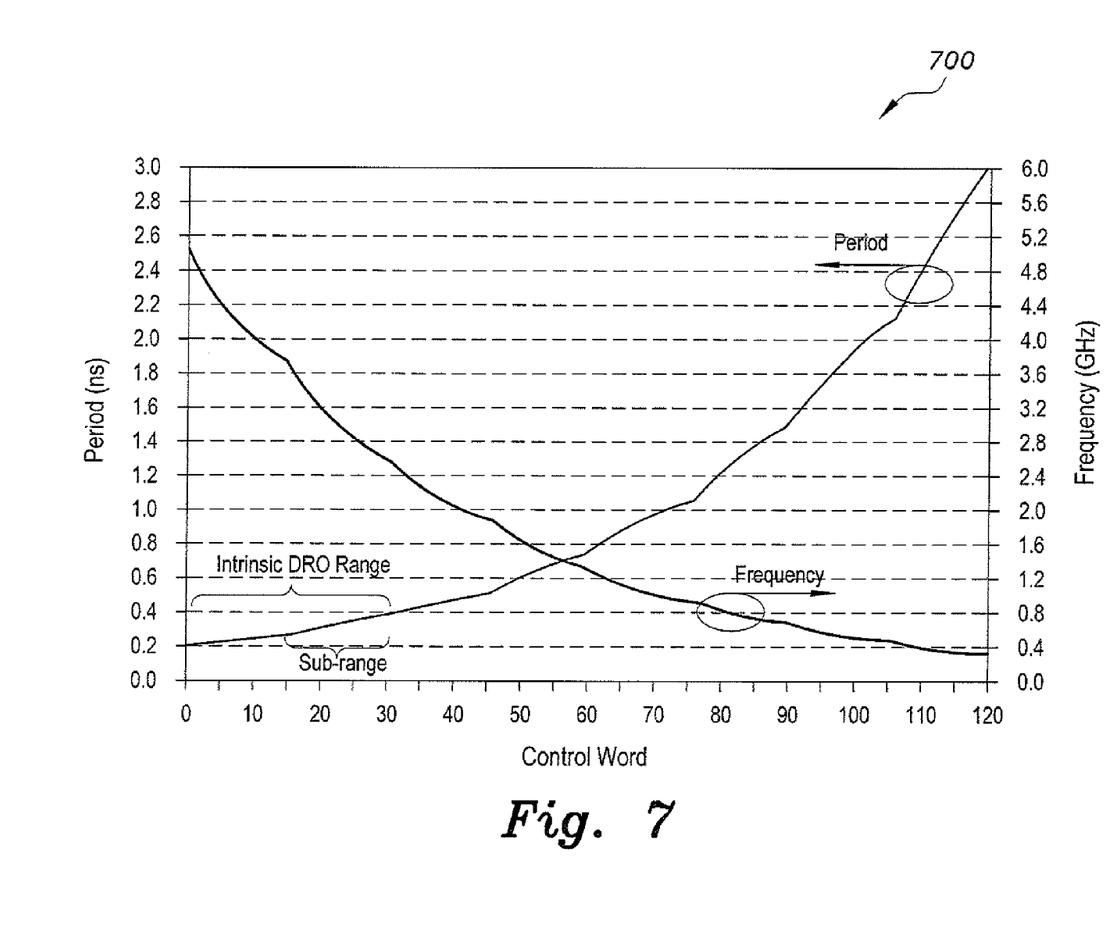
FIG. 7 is a plot showing frequency characteristics of a simulated high-frequency digitally controlled oscillator according to the present invention with a 3-stage DRO.

FIG. 7 shows the output period and frequency of a DCO with a 3-stage DRO (2 DDSs and a merging NAND stage) obtained from Spice simulations using a 0.13 μm, 1.2 V technology. The DDSs are controlled in tandem fashion, each having 4-bit control words. For range extension, a 3-bit counter is used (hence division by up to 8). It should be noted that non-monotonic transitions at the borders between adjacent ranges won't cause any problem. This is due to the fact that transitioning from one range to another is accomplished using the selection multiplexer 16. Hence, the DRO will have the same frequency for all ranges.

Figure 8:
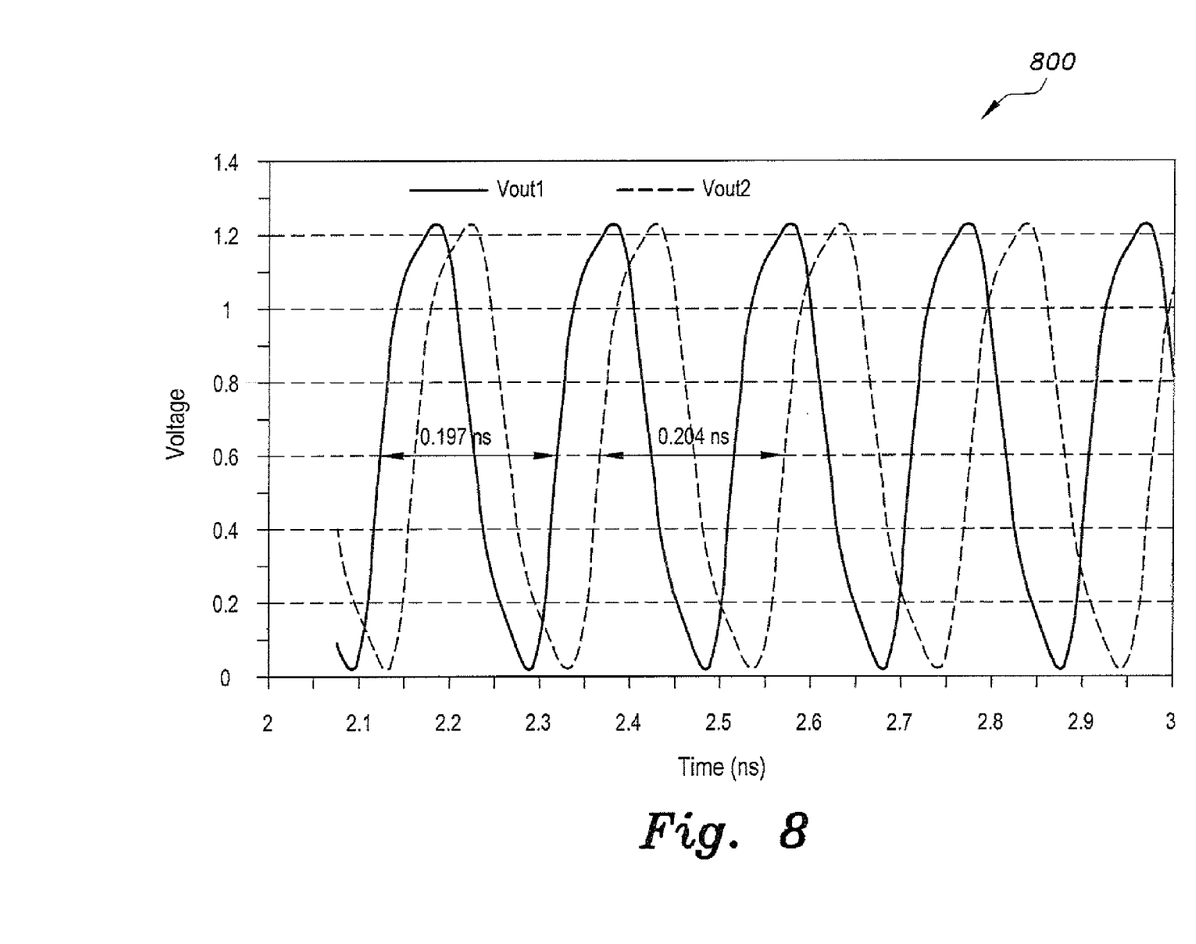
FIG. 8 is a plot showing a comparison of output voltage as a function of time for a DRO with matched oscillators vs. a 10% mismatch in the oscillators in a high-frequency digitally controlled oscillator according to the present invention.

Since both oscillators 183, 184 in the DRO are supposed to be oscillating in synchronization, process variations may cause one oscillator to be slower than the other. The Merging NAND 20 synchronizes both oscillators 183, 184 such that the increased delay is divided among the two oscillators. FIG. 8 shows a plot 800 of the DRO's output at maximum frequency for two conditions, first with identical oscillator transistors, and then with a 10% increase in the channel lengths of all transistors in one oscillator (to study the effects of process mismatch). The DRO still functions properly and the frequency is reduced by only 5%, instead of the normal 10% that would be obtained with a single oscillator.

It is to be understood that the present invention is not limited to the embodiments described above, but encompasses any and all embodiments within the scope of the following claims.

I claim:

1. A high-frequency digitally controlled oscillator, comprising:
an even number of digital delay stage (DDSs) circuits, each of the DDS circuits having at least one capacitive load cell, each of the capacitive load cells having a digital switch, each of the digital switches being configured to turn on and off in response to control words applied to the switches to change the capacitance of the capacitive load cell;
two digital oscillators having identical inverters, each of the digital oscillators having a plurality of stages arranged in cascade, each of the stages having at least two of the DDS circuits;
a merging NAND gate, the two digital oscillators each having a high frequency output fed through the cascade of DDS stages to an input of the merging NAND gate, the NAND gate having an output;
a counter, the output of the merging NAND gate being fed to an input of the counter, the counter having an output; and
a multiplexer, the output of the merging NAND gate and the output of the counter being input to the multiplexer, the multiplexer having an output;
wherein the multiplexer output has a frequency programmably determined by the control words applied to the switches of the capacitive load cells of the DDS circuits.

2. The high-frequency digitally controlled oscillator according to claim 1, wherein said at least one capacitive load cell comprises two series-connected metal capacitors and a node between the two series-connected capacitors, the digital switch in said at least one capacitive load cell being a MOSFET switch connected between the node and ground, whereby the capacitive load in each of the stages of the cascades is switchable between the junction capacitance of the MOSFET switch when the switch is turned off and the capacitance of the metal capacitors when the MOSFET is turned on, permitting tuning the oscillator over a large frequency range.

3. The high-frequency digitally controlled oscillator according to claim 1, wherein said control words comprise a thermometer pattern of bits.

4. The high-frequency digitally controlled oscillator according to claim 1, wherein said control words comprise a round-robin binary pattern of bits.

5. The high-frequency digitally controlled oscillator according to claim 1, wherein each said DDS circuit has a maximum delay and a minimum delay, the maximum delay being at least twice the minimum delay.

6. The high-frequency digitally controlled oscillator according to claim 5, further comprising a load capacitance configuration conforming to the relation;

$$C \geq \frac{C_{in} + (2^n - 1)C_j}{(2^n - 1)} = \frac{C_{in}}{2^n - 1} + C_j,$$

where C is total capacitance of said capacitive load, $C_{in}$ is an input capacitance of said capacitive load, and $C_j$ is a drain junction capacitance associated with said digital switch controlling said capacitive load.

7. The high-frequency digitally controlled oscillator according to claim 6, wherein said high-frequency digitally controlled oscillator comprises a three-stage digital ring oscillator implemented in a 0.13 μm technology having a 4-bit control word, wherein the value for C is 0.5 fF, thereby yielding a frequency range of 2.5 to 5 GHZ.

* * * * *